(12) United States Patent
Baier et al.

(10) Patent No.: US 11,398,862 B2
(45) Date of Patent: Jul. 26, 2022

(54) SATELLITE UPLINK AMPLIFIER AND METHOD FOR PROVIDING A MULTIBAND UPLINK SIGNAL

(71) Applicant: Rohde & Schwarz GmbH & Co. KG, Munich (DE)

(72) Inventors: Christian Baier, Berlin-Lichtenberg (DE); Florian Ohnimus, Berlin (DE); Sebastian Preis, Berlin (DE); Lothar Schenk, Berlin (DE); Raimon Goeritz, Berlin (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 35 days.

(21) Appl. No.: 17/072,179

(22) Filed: Oct. 16, 2020

(65) Prior Publication Data

US 2022/0123829 A1    Apr. 21, 2022

(51) Int. Cl.
    *H04B 7/185*    (2006.01)
    *H04B 7/155*    (2006.01)
    *H03F 3/68*     (2006.01)
    *H03F 3/24*     (2006.01)

(52) U.S. Cl.
    CPC .......... *H04B 7/18515* (2013.01); *H03F 3/24* (2013.01); *H03F 3/68* (2013.01); *H04B 7/15535* (2013.01); *H03F 2200/451* (2013.01)

(58) Field of Classification Search
    CPC .......... H04B 7/18515; H04B 7/15535; H04B 1/0053; H04B 1/401; H04B 7/0413; H04B 1/40; H04B 1/04; H04B 1/0483; H04B 1/406; H04B 2001/0408; H04B 7/0689; H03F 3/68; H03F 3/24; H03F 2200/451

USPC ..................................................... 455/91–129
See application file for complete search history.

(56) References Cited

U.S. PATENT DOCUMENTS

| | | | | |
|---|---|---|---|---|
| 8,995,936 | B2* | 3/2015 | Desclos | H03F 1/3241 |
| | | | | 455/114.3 |
| 10,149,298 | B2* | 12/2018 | Chang | H04J 14/00 |
| 10,454,570 | B2 | 10/2019 | Mendelsohn | |
| 10,735,089 | B2 | 8/2020 | Mendelsohn | |
| 10,778,270 | B1* | 9/2020 | Jansen | H01L 23/5385 |
| 2010/0158083 | A1* | 6/2010 | Morris | H03F 3/211 |
| | | | | 455/296 |
| 2014/0009224 | A1* | 1/2014 | van Zelm | H03F 1/3247 |
| | | | | 330/84 |
| 2017/0207761 | A1* | 7/2017 | Raman | H03F 3/005 |
| 2018/0159483 | A1* | 6/2018 | Masood | H04B 1/0475 |
| 2018/0367100 | A1* | 12/2018 | Ejeckam | H01L 23/66 |
| 2019/0123813 | A1 | 4/2019 | Mendelsohn | |

(Continued)

FOREIGN PATENT DOCUMENTS

DE    2758406 B1    5/1979
WO    2017117584 A1    7/2017

*Primary Examiner* — Lana N Le
(74) *Attorney, Agent, or Firm* — Westman, Champlin & Koehler, P.A.

(57) ABSTRACT

An improved amplification of multiband signals for an uplink, in particular a satellite uplink is provided. For this purpose, multiple signals for separate frequency bands may be provided to a number of two or more uplink converters. The output of each uplink converter is amplified by a separate amplifier and the separately amplified signals are combined to obtain an amplified multiband uplink signal. In particular a waveguide combiner may be used for combining the amplified signals.

18 Claims, 4 Drawing Sheets

(56) References Cited

U.S. PATENT DOCUMENTS

2019/0379449 A1 12/2019 Mendelsohn
2020/0266885 A1 8/2020 Mendelsohn

* cited by examiner

SATELLITE UPLINK AMPLIFIER AND METHOD FOR PROVIDING A MULTIBAND UPLINK SIGNAL

TECHNICAL FIELD

The present invention relates to a satellite uplink amplifier, in particular a satellite uplink amplifier for providing a multiband uplink signal. The present invention further relates to a method for providing a multiband uplink signal for a satellite uplink.

BACKGROUND

Even though applicable in general to any kind of uplink amplifier, the present invention and its underlying problem will be herein described in connection with a satellite uplink amplifier.

When operating a satellite network, it is desirable to perform data transmission, in particular in an uplink stream, by multiple carriers with high bandwidths. However, amplification of such broadband signals with sufficient linearity is a challenging task.

For example, tube amplifiers such as travelling wave tube amplifiers (TWTA) may be used. Beyond that, the use of amplifiers on the basis of semiconductors also becomes increasingly desirable in this area. However, linearization of semiconductor amplifiers is still challenging. Especially, linearizers for semiconductor amplifiers usually only have limited bandwidth.

Against this background there is a need for an improved concept of broadband amplification by semiconductor amplifiers, in particular for amplifying broadband signals in the environment of satellite uplink.

SUMMARY

The present invention provides a satellite amplifier and a method for providing a multiband uplink signal for satellite uplink with the features of the independent claims. Further advantageous embodiments are subject matter of the dependent claims.

According to a first aspect, a satellite uplink amplifier is provided. The satellite uplink amplifier may provide a multiband uplink signal. The satellite uplink amplifier comprises at least two uplink converters, at least two linearizers, at least two amplifiers and a combiner. The number of the at least two amplifiers may correspond to the number of the linearizers and the number of uplink converters. The at least two uplink converters are configured to upconvert an input signal to an uplink signal. The at least two linearizers are configured to equalize one of the upconverted input signals and output an equalized signal. Each of the at least two amplifiers is configured to amplify one of the equalized signals and output an amplified signal. The combiner is configured to combine the amplified signals provided by the at least two amplifiers and output a combined signal as a multiband uplink signal.

According to a further aspect, a method for providing a multiband uplink signal for a satellite uplink is provided. The method comprises upconverting at least two input signals to uplink signals. The upconverting of the input signals may be performed by at least two uplink converters. The method further comprises equalizing the upconverted input signals.

The equalized signals may be output as equalized signals, respectively. The equalization may be performed by at least two linearizers. The method further comprises amplifying the equalized signals and outputting the amplified signals. The amplification of the equalized signals may be performed by at least two amplifiers. Finally, the method may comprise combining the amplified signals and outputting the combined signal as a multiband uplink signal. The combining of the amplified signals may be performed by a combiner.

The present invention is based on the finding that an appropriate linear amplification of signals by semiconductor amplifiers in the environment of satellite uplinks usually is limited to narrow bandwidths, e.g. a bandwidth of less than 100 MHz. However, for efficiently operating communications via satellites, especially for improved uplink communication to a satellite, carriers with high bandwidths, especially bandwidths larger than 100 MHz, up to 750 MHz is desirable.

The present invention takes into account this finding and aims to provide an improved amplification of multicarrier signals for satellite uplink.

It is for this purpose that multiple signals of a multiband uplink signal are upconverted and amplified individually by multiple uplink converters and amplifiers. Subsequently, the upconverted and amplified signals are combined to obtain an amplified multiband signal with high bandwidth. Accordingly, the amplification and the related linearization of the individual upconverted signals can be performed by multiple linearizers and amplifiers each operating only in a narrow bandwidth. Accordingly, high linearization of the amplified signals can be achieved by each of the multiple amplification units. Subsequently, by combining the individually amplified upconverted signals, a multicarrier signal with a high bandwidth is obtained.

Since each signal path of uplink converter, linearizer and amplifier only has to deal with a limited, narrow bandwidth, it is possible to perform the respective linearization and amplification by amplifiers of limited bandwidth, for example, by appropriate semiconductor amplifiers. In this way, the individual signals can be amplified with high quality. Subsequently, the amplified signals are combined together to a multicarrier signal which can be used, for example, for satellite uplink.

The uplink converters of the uplink amplifier may be any kind of appropriate uplink converter. Especially, the uplink converters may be individual uplink converters which can perform an upconverting of an input signal to a desired carrier frequency. For this purpose, the uplink converter may comprise appropriate components such as, for example, signal sources, e.g. a local oscillator, mixers, couplers, switches, pre-amplifiers or the like. Each uplink converter may receive an input signal and modulate the received input signal to a desired carrier frequency. Accordingly, each uplink converter may output a modulated carrier signal. For example, the uplink converter may provide an output signal in the Ku-Band of about 13 GHz, especially in the range of 12.75 to 13.25 GHz or 13.75 to 15 GHz. However, depending on the desired frequency range for satellite uplink, any other appropriate frequency range may be possible, too.

Since the satellite uplink amplifier according to the present invention aims to provide a multiband uplink signal, a separate uplink converter may be used for each frequency band of the multiband uplink signal. For this purpose, the satellite uplink amplifier comprises two or even more separate uplink converters.

The output of each uplink converter is provided to a related amplification unit comprising a linearizer and an amplifier, respectively. Accordingly, the output of each upconverter is linearized and amplified, separately. The amplification may be performed by an appropriate semiconductor amplifier. For example, a satellite uplink amplifier such as Rohde & Schwarz® PKU100 may be used for this purpose. However, it is understood, that any other appropriate amplifier may be possible, too.

Each linearizer which is related one of the amplifiers may compensate non-linearities of the amplifier in order to achieve a linear amplification of the upconverted signal. Since each unit of linearizer and amplifier only operates in a limited, narrow bandwidth, a high quality linear amplification of the respective signal can be achieved.

Subsequently, after the individual signals have been upconverted and amplified by separate signal paths, the multiple amplified signals are combined together to a multiband signal. Accordingly, the combination of the individual carriers is performed after separately upconverting and amplification of the individual signals. Hence, all operations of upconverting, linearization and amplification only relate to signals of small bandwidth.

The combination of the individual amplified signals can be performed by any kind of appropriate combiner or combining arrangement. For example, one or more waveguide combiners may be used for combining the output signals of the individual amplifiers.

Hence, after combining the individual amplified signals, a single multiband signal with multiple carriers is achieved. Since the upconverting and amplification is performed by multiple signal paths all operating in a narrow bandwidth, the upconverting can be performed with high linearity, and thus, all signal components in the multiband uplink signal are provided with high linearity.

Further embodiments of the present invention are subject of the further subclaims and of the following description referring to the drawings.

In a possible embodiment, the satellite uplink amplifier comprises an input interface. The input interface may be configured to receive at least two input signals. For example, the individual input signals may be received by separate input terminals. The input interface may provide each of the received input signals to one of the at least two uplink converters. Accordingly, each received input signal is provided to a separate uplink converter. In this way, each input signal may be upconverted separately, and thus, a separate carrier may be used for each of the received input signals. Especially, the bandwidth of each of the at least two input signals may be a partial bandwidth of an aggregate bandwidth of a master signal. Accordingly, the master signal may be provided to the input interface by multiple individual signals having limited bandwidths. For example, the bandwidth of each input signal may be than 100 MHz, especially less than 80 MHz. It may be also possible that the bandwidth of each input signal may be e.g. 36 MHz.

In a possible embodiment, the satellite uplink amplifier may comprise a splitter. The splitter may be configured to receive a master signal. The master signal may have a specific input bandwidth. Especially, the input bandwidth may be larger than 100 MHz. For example, the input bandwidth of the master signal may be in a range up to 750 MHz. The splitter may be configured to split the master signal into at least two partial signals. Each of the partial signals may have a predetermined bandwidth. The predetermined bandwidths of the partial signals may be equal or less than 100 MHz, in particular less than 80 MHz or 36 MHz or less. For example, the splitter may split the master signal into multiple signals each having a same or almost same bandwidth. However, it may be also possible that the bandwidth of the individual partial signals may be different from each other. The splitter may be further configured to provide each of the at least two partial signals to one of the at least two uplink converters. In particular, the splitter may provide the multiple partial signals to the multiple uplink converters in parallel. In this way, it is possible to upconvert and amplify signals with high bandwidths by splitting the signal into multiple signals having a smaller bandwidth and separately upconverting and amplifying the individual portions of the signal. For this purpose, any appropriate splitter may be used. For example, the splitter may comprise frequency filters or the like for splitting the master signal with the high bandwidth into multiple partial signals having smaller bandwidths.

In a possible embodiment, each of the at least two amplifiers may be implemented as a separate device. Especially, each amplifier may be arranged in a separate housing. For example, each amplifier or combination of linearizer and amplifier may be a separate device. Accordingly, an input of such a device may be connected to an output of one of the upconverters, and an output of the amplifier may be connected to an input of the combiner. In this way, it is even possible to use multiple conventional amplifiers operating with a limited small bandwidth in order to obtain a multi-carrier signal with high bandwidth.

In a possible embodiment, each of the at least two amplifiers may comprise a separate controller for controlling the respective amplifier. Especially, each of the two amplifiers may be completely independent of the further amplifiers. For example, each amplifier may also comprise a separate power supply. Accordingly, in case that the individual amplifiers are completely independent of each other, a fail of one amplifier does not have any impact to the operations of the remaining amplifiers.

Moreover, by providing a satellite uplink amplifier arrangement with one or more redundant amplifiers, the reliability of the system can be further improved. For example, the arrangement may further comprise an appropriate switching matrix for selectively coupling the output of the upconverters with the input of the amplifiers and/or the output of the amplifiers with the coupler. In this way, an erroneous amplifier or combination of linearizer and amplifier may be dropped out and the respective signal may be provided to another amplifier by configuring the switching matrix accordingly.

In a possible embodiment, the at least two uplink converters may be configured to convert the respective input signal to a selectable frequency band. For example, the carrier frequency of each uplink converter may be configured individually. For this purpose, any kind of appropriate configuration scheme may be possible. For example, a frequency of an internal signal source, e.g. the local oscillator, or the like may be configurable. Additionally or alternatively, it may be also possible to provide an appropriate signal for specifying the carrier frequency from an external source or the like. In this way, the frequencies comprised in the multiband uplink signal of the satellite uplink amplifier can be configured with high flexibility depending on the desired requirements.

For example, the individual frequency bands of the upconverters may be selected out of a number of predetermined frequency bands. For example, the frequencies used by the uplink converters may relate to frequency bands of the Ku-Band, e.g. in the range of 13 GHz. For example, the frequency bands may be in a range of 12.75-14.5 GHz, especially between 12.75-13.25 GHz or 13.75-14.5 GHz. However, it is understood, depending on the application any other kind of frequency ranges may be possible, too.

In a possible embodiment, the frequency bands used by the at least two uplink converters may overlap. In this way, it may be possible to obtain a multiband uplink signal of a wide frequency range without gaps.

With the present invention it is therefore possible, to generate a multiband uplink signal for a satellite uplink covering a broad frequency range. For this purpose, a broadband signal may be split into multiple signals of smaller bandwidths, or alternatively multiple separate input signals of a small bandwidth may be used. The multiple signals of small bandwidth are upconverted by separate upconverters and subsequently, each upconverted signal is amplified separately. The individually amplified signals are combined together, for example by a waveguide combiner or the like. In this way, the upconverted signals with small bandwidth can be amplified with high linearity. The resulting combined signal comprises a multiband signal with a wide bandwidth, wherein the individual components all are amplified with high linearity.

BRIEF DESCRIPTION OF THE DRAWINGS

For a more complete understanding of the present invention and advantages thereof, reference is now made to the following description taking in conjunction with the accompanying drawings. The invention is explained in more detail below using exemplary embodiments, which are specified in the schematic figures and the drawings, in which.

Figure 1:
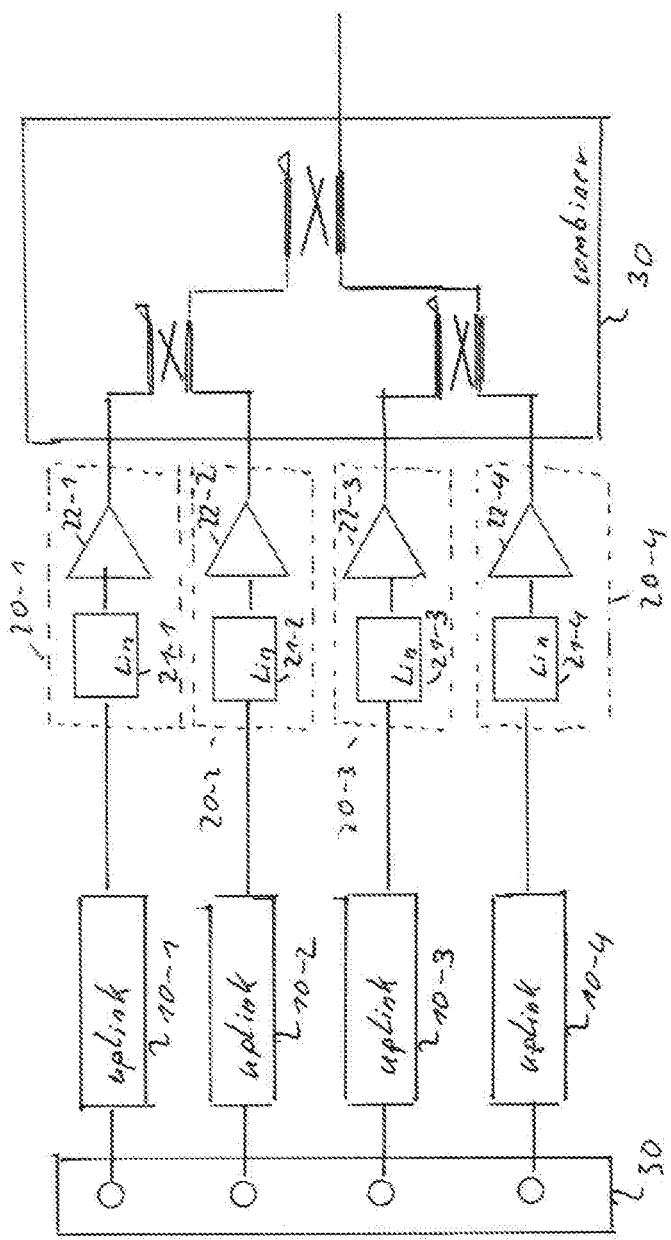
FIG. 1: shows a schematic block diagram of a satellite uplink amplifier according to an embodiment.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown in scale.

In the drawings, same, functionally equivalent and identical operating elements, features and components are provided with same reference signs in each case, unless stated otherwise.

DESCRIPTION OF EMBODIMENTS

FIG. 1 shows a schematic block diagram of a satellite uplink amplifier 1 according to an embodiment. The satellite uplink amplifier 1 comprises a number of at least two uplink converters 10-$i$, a number of at least two linearizers 20-$i$ and a corresponding number of at least two amplifiers 30-$i$. The satellite uplink amplifier 1 further comprises a combiner 30. Especially, the number of uplink converters 10-$i$, the number of linearizers 20-$i$ and the number of amplifiers 22-$i$ may be the same. The number of four uplink converters 10-$i$, linearizers 21-$i$ and amplifiers 30-$i$ only serves as an example and does not limit the present invention. Moreover, any other number of two or more uplink converters 10-$i$, linearizers 21-$i$ and amplifiers 22-$i$ may be possible.

The satellite uplink amplifier 1 may further comprise an input interface 50 for receiving input signals. For example, input interface 50 may comprise a number of two or more input ports, wherein each input port is connected with an input of a related uplink converter 10-$i$. In this way, each signal provided to an input port of input interface 50 is provided to one of the uplink converters 10-$i$.

Alternatively, it may be possible to receive an input signal by a terminal of the input interface 50 and split the received input signal to a number of two or more partial signals. For example, the input signal may be split to the multiple partial signals by a splitter or the like. In this case, each partial signal may be provided to a separate uplink converter 10-$i$. This approach will be described in more detail below.

In any case, each uplink converter 10-$i$ may be provided with an appropriate input signal. The signal provided to the individual uplink converters 10-$i$ may have relative small bandwidth. Especially, the bandwidth of the input signals may be in a range wherein the related linearizer 21-$i$ and amplifier 22-$i$ can perform a linear amplification of the output provided by the related uplink converter 10-$i$. For example, the input signals provided to the uplink converters 10-$i$ and accordingly, the output signals provided by the uplink converters 10-$i$, may have a bandwidth of maximum 100 MHz or less. Especially, the bandwidth of the signals provided to the uplink converters 10-$i$ may have a bandwidth of 80 MHz or less, for example a bandwidth of 36 MHz. However, any other limitation for the bandwidth provided to the uplink converters 10-$i$ according to the properties of the related linearizers 21-$i$ and amplifiers 222-$i$ may be possible, too.

Each uplink converter 10-$i$ may modulate the respective input signal with a specific carrier frequency. For example, the uplink converters 10-$i$ may comprise an internal signal source, for example a local oscillator, for providing a radio frequency signal. Accordingly, the input signal received by the respective uplink converter 10-$i$ may be mixed with the generated radio frequency signal, and thus, an upconverted signal is achieved. For example, the input signal and the internal radio frequency signal may be provided to a mixer, and the mixer outputs the upconverted signal. It is understood, that the uplink converters 10-$i$ may also comprise any kind of additional components such as filters, pre-amplifiers, couplers or the like.

In this way, each uplink converter 10-$i$ may provide an uplink signal of a frequency band according to the radio frequency of the uplink converter 10-$i$ which is used for upconverting the input signal. In particular, the bandwidth of the output signal provided by the uplink converters 10-$i$ may correspond to the bandwidth of the input signal provided to the respective uplink converter 10-$i$.

As already mentioned above, the satellite uplink amplifier 1 comprises multiple uplink converters 10-$i$. Each uplink converter 10-$i$ may use an individual frequency for upconverting the received input signal, respectively. Hence, each uplink converter 10-$i$ may provide an output signal of a different frequency band. The frequency for upconverting the input signal may be selected individually for each of the upconverters 10-$i$. For example, the desired radio frequency for upconverting an input signal or the resulting frequency band of an output signal of an uplink converter 10-$i$ may be free of choice for each of the uplink converters 10-$i$. In particular, the respective parameters for selecting the frequency band of the output of an uplink converter 10-$i$ may be selected freely within a predetermined range. For example, each uplink converter 10-$i$ may perform an upconverting of the input signal to a frequency band of the Ku-Band, for instance in the range of about 13 GHz. For example, the output of each uplink converter 10-$i$ may relate to a frequency band in a frequency range between 12.75 and 14.5 GHz, especially between 12.75 to 13.25 GHz or 13.75 to 14.5 GHz. However, depending on the respective application, any other appropriate frequency constraints may be possible, too.

If the radio frequency signals for upconverting the input signal are generated locally within the respective uplink converters 10-$i$, each uplink converter 10-$i$ may comprise appropriate components for generating the desired frequency signals. Especially, each uplink converter 10-$i$ may receive an appropriate control signal for specifying the desired frequency band of the output signal provided by the uplink converter 10-$i$ and for configuring the respective uplink converter 10-$i$ accordingly. Alternatively, it may be also possible to provide the required radio frequency signals for upconverting the input signal from an external signal source and to use this externally provided radio frequency signal for upconverting the input signal.

The output of each uplink converter 10-$i$ may be provided to a related amplification unit 20-$i$. Each amplification unit 20-$i$ may comprise at least a linearizer 21-$i$ and an amplifier 22-$i$. As will be described in more detail below, each amplifying unit 20-$i$ or each amplifier 22-$i$ may be provided an individual device in a separate housing. However, it may be also possible to combine multiple amplifying units 20-$i$ and/or amplifiers 22-$i$ with a common device or a common housing.

Each linearizer 21-$i$ may receive the output signal of a related uplink converter 10-$i$. The linearizers 21-$i$ may adapt the received signal in order to compensate or equalize non-linearities of the related amplifier 22-$i$. In this way, the output provided by the amplifiers 22-$i$ may correspond to an almost linear amplification of the upconverted signals provided by the uplink converters 10-$i$. As will be described in more detail below, linearizer 21-$i$ may refer to a feedback from the related amplifier 22-$i$ in order to establish a control loop for adaptively controlling the linearization.

The amplifier 22-$i$ may comprise, for example amplifying circuits on the basis of semiconductor amplifiers. For example, the amplification of each signal provided by one of the multiple uplink converters 10-$i$ may be performed by a separate amplification device such as, for example, Rohde & Schwarz® PKU100 or the like. In this way, each frequency band provided by one of the uplink converters 10-$i$ is linearized and amplified by a related separate amplification unit 20-$i$. Since each output of an individual uplink converter 10-$i$ only relates to a frequency band of a relative narrow bandwidth, in particular a bandwidth of less than 100 MHz, the linearization and amplification also has to be applied to such a narrow bandwidth. Accordingly, the amplifiers 22-$i$ only have to perform a linear amplification within this narrow bandwidth of less than 100 MHz, in particular less than 80 MHz, for example within a bandwidth of 36 MHz. However, it is understood that depending on the respective application, any other appropriate constraints may be possible, too.

The output of the multiple amplifying units 20-$i$, in particular the output of the amplifiers 22-$i$ may be provided to combiner 30. Accordingly, combiner 30 may combine the amplified signals which are provided by the multiple amplifiers 22-$i$ to a common single signal. For example, combiner 30 may comprise one or more waveguide combiners for combining the output signals provided by the amplifiers 22-$i$. However, any other appropriate configuration for combining the output signals from the amplifiers 22-$i$ may be possible, too. Accordingly, the output signal of combiner 30 comprises the amplified signals of all uplink converters 10-$i$.

In this way, the output of combiner 30 comprises amplified signals of multiple frequency bands according to the individual frequency bands provided by the uplink converters 10-$i$.

Combiner 30 may comprise an even number of input ports for receiving amplified signals from the amplifiers 22-$i$. Especially, combiner 30 may comprise a number of input ports which corresponds to $2^n$, wherein n is a positive integer number. In this case, combiner 30 can be realized by a number of waveguide combiner elements each having two input ports.

With the above described configuration, a multicarrier signal for an uplink, in particular a satellite uplink can be generated, wherein the multicarrier signal comprises signals of multiple frequency bands. Since the multicarrier signal is generated by upconverting input signals by multiple uplink converters in parallel and individually amplifying the upconverted signals before combining the amplified signals together to a common multicarrier uplink signal, a linear amplification of all frequency bands can be achieved.

Figure 2:
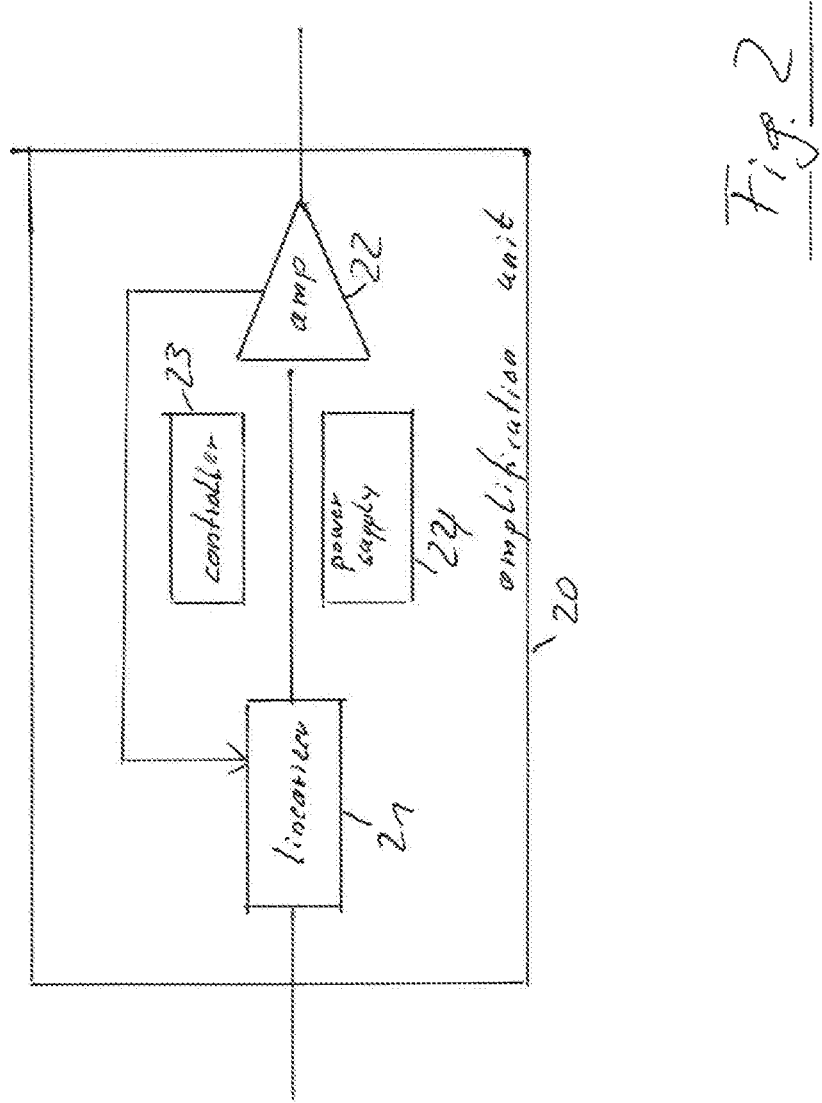
FIG. 2: shows a schematic block diagram of an amplification device for a satellite uplink amplifier according to an embodiment.

FIG. 2 shows a schematic block diagram illustrating an amplification unit 20 which may be used in a satellite uplink amplifier 1 according to an embodiment. As can be seen in FIG. 2, each amplification unit 20 may comprise a linearizer 21 and an amplifier 22. For example, linearizer 21 may comprise any kind of elements for adapting an input signal in such a manner that the amplified output of amplifier 22 relates to a linear amplification of the input signal. For this purpose, linearizer 21 may comprise elements such as pre-amplifiers, biasing elements, filters or the like. In particular, a feedback from amplifier 22 to linearizer 21 may be provided. In this way, the amplification operation of amplifier 22 may be continuously monitored in order to adapt the properties of linearizer 21 accordingly for achieving a linear amplification. In this way, an adaptive configuration or parametrization of linearizer 21 can be achieved.

As can be further seen in FIG. 2, each amplification unit 20 may comprise a separate controller 23 for controlling operations. Controller 23 may adapt, for example, a parametrization of linearizer 21 and/or control the operational parameters of amplifiers 22. Furthermore, each amplification unit 20 may comprise a separate power source 24. In this way, each amplification unit 20 may be operated independently. Thus, a failure in one of the amplification units 20 does not have any impact to operations of the remaining amplification units 20.

In case that each amplification unit 20 or at least each amplifier 22 is realized as a separate, independent device, it may be possible to arrange each amplification unit 20 or at least each amplifier 22 as a separate device in a separate housing. Accordingly, the complete arrangement of the satellite uplink amplifier system 1 can be easily upscaled by adding further amplification units 20-$i$ and, if necessary, further uplink converters 10-$i$. Moreover, in case of a failure, an erroneous amplification unit can be easily replaced by another amplification unit 20-$i$ without any further modifications to the satellite uplink amplifier arrangement 1.

Figure 3:
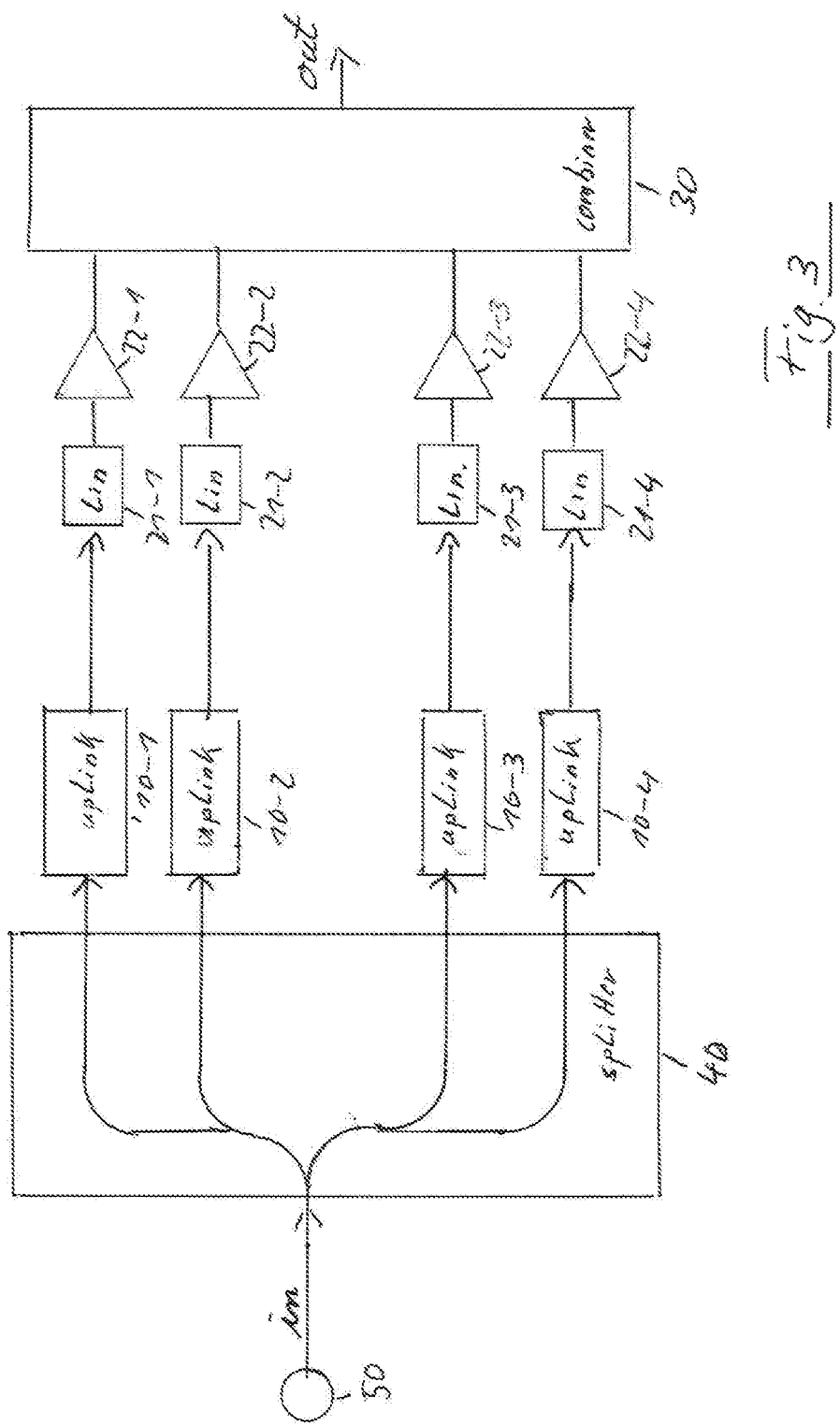
FIG. 3: shows a schematic block diagram of a satellite uplink amplifier according to another embodiment.

FIG. 3 shows a schematic block diagram of a satellite uplink amplifier arrangement 1 according to a further embodiment. The satellite uplink amplifier arrangement 1 according to FIG. 3 mainly corresponds to the previously described configurations. The arrangement according to FIG. 3 differs from the previously described configuration in that a splitter 40 is provided. Splitter 40 may receive as an input a main signal with a relative high bandwidth. In particular, the bandwidth of the signal received by splitter 40 may be larger than 100 MHz. The bandwidth of the main signal received by splitter 40 may be, for example, up to 750 MHz.

Splitter 40 may divide the received main signal with the relative high bandwidth to multiple partial signals. Each partial signal may relate to a sub-signal of the main signal with a smaller bandwidth. For example, the bandwidth of each partial signal may be equal or less than 100 MHz, especially less than 80 MHz. For example, each sub-signal may have a bandwidth of about 36 MHz. However, depending on the applications, any other bandwidth constraint may be applied when splitting the main signal to partial signals by splitter 40.

For splitting the main signal into multiple sub-signals, splitter 40 may comprise appropriate splitting elements, for example, frequency filters or the like. In particular, splitter 40 may be, for example, a configurable splitter. In such a case, the configuration or properties of splitter 40 may be adapted depending on specific settings. For example, it may be possible to specify requirements with respect to the number of partial signals, a maximum bandwidth or any other constraints.

When splitting the main signal into a number of partial signals, the frequency bands of adjacent sub-signals may overlap. For example, adjacent sub-signals may overlap by a predetermined frequency range. However, any other constraints for splitting the main signal into a number of partial signals may be also possible.

After splitting the main signal into the number of partial signals, each partial signal may be provided to a separate uplink converter 10-*i*. Each uplink converter 10-*i* may perform an upconverting of the respective partial signal and provide the upconverted partial signal to an amplification unit 20-*i*. Further, the amplified partial signals are provided to combiner 30 which combines the amplified partial signals to a common signal. In this way, combiner 30 may output an amplified signal for an uplink, in particular a satellite uplink comprising multiple carriers for transmitting the main signal provided to splitter 40.

Figure 4:
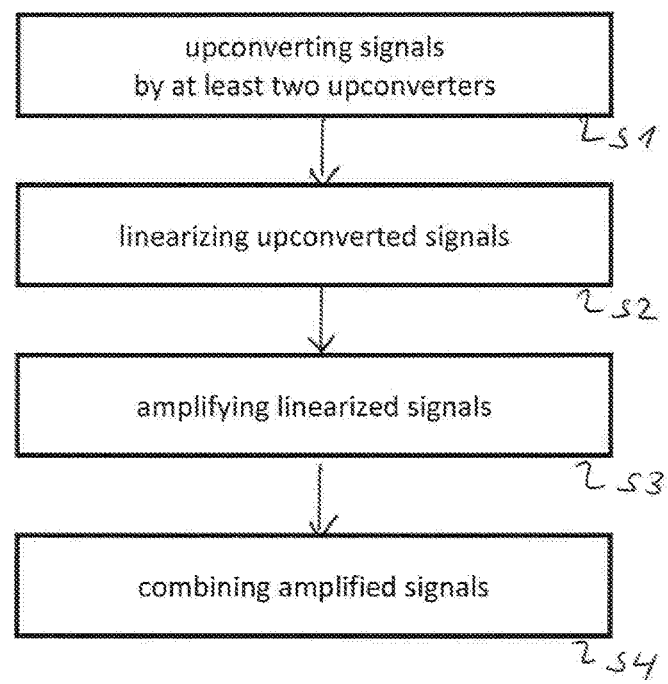
FIG. 4: shows a flow diagram illustrating a method for providing a multiband uplink signal according to an embodiment.

FIG. 4 shows a flow diagram illustrating a method for providing a multiband uplink signal for a satellite uplink according to an embodiment. In general, the method may comprise any step for performing operations as already described above in connection with the satellite uplink amplifier 1. Accordingly, the above described embodiments for a satellite uplink amplifier 1 may comprise any kind of components in order to perform operations as described below in connection with the method for providing the multiband uplink signal.

In a step S1, at least two input signals are upconverted to uplink signals. The upconverting of the input signals may be performed by a number of at least two uplink converters.

In a step S2, the upconverted input signals are equalized. The equalization of the upconverted input signals may be performed by at least two linearizers 21-*i*. In particular, each linearizer 21-*i* may receive an upconverted signal from a related uplink converter 10-*i*.

In step S3, each equalized signal is amplified. The amplification may be performed by a number of amplifiers, wherein a separate amplifier may be provided for each uplink converter 10-*i*.

Finally, in step S4, the amplified signals are combined together by combiner 30, and the resulting combined signal may be output as a multiband uplink signal.

Summarizing, the present invention provides an improved amplification of multiband signals for an uplink, in particular a satellite uplink. For this purpose, multiple signals for separate frequency bands may be provided to a number of two or more uplink converters. The output of each uplink converter is amplified by a separate amplifier and the separately amplified signals are combined to obtain an amplified multiband uplink signal. In particular a waveguide combiner may be used for combining the amplified signals.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS

1 uplink amplifier
10, 10-*i* uplink converter
20, 20-*i* amplification unit
21, 21-*i* linearizer
22, 22-*i* amplifier
30 combiner
40 splitter
50 input

The invention claimed is:

1. A satellite uplink amplifier for providing a multiband uplink signal, comprising:
   at least two uplink converters, each uplink converter being configured to upconvert an input signal to an uplink signal;
   at least two linearizers, each linearizer being configured to linearize one of the upconverted input signals and output a linearized signal;
   at least two amplifiers, each amplifier being configured to amplify one of the linearized signals and output an amplified signal;
   a combiner for combining the amplified signals and outputting a combined signal as a multiband uplink signal; and
   an input interface for receiving at least two input signals and providing each of the received input signals to one of the at least two uplink converters, wherein a bandwidth of each of the at least two input signals is a partial bandwidth of an aggregate bandwidth of a master signal.

2. The satellite uplink amplifier of claim 1, comprising a splitter for receiving a master signal with an input bandwidth, splitting the master signal to at least two partial signals, each partial signal having a predetermined bandwidth which is smaller than the bandwidth of the master signal, and providing each of the at least two partial signals to one of the at least two uplink converters in parallel.

3. The satellite uplink amplifier of claim 1, wherein each of the at least two amplifiers is implemented as a separate device.

4. The satellite uplink amplifier of claim 3, wherein each of the at least two amplifiers comprises a separate controller for controlling the respective amplifier.

5. The satellite uplink amplifier of claim 1, wherein the at least two uplink converters are configured to convert the respective input signal to selectable frequency band.

6. The satellite uplink amplifier of claim 5, wherein the at least two uplink converters are configured to convert the respective input signal to overlapping frequency bands.

7. The satellite uplink amplifier of claim 1, wherein the combiner comprises a waveguide combiner.

8. The satellite uplink amplifier of claim 1, wherein the at least two linearizers comprise adaptive linearizers configured to adapt the linearization of the respective linearizer according to a feedback from the amplifier connected to the respective linearizer.

9. A method for providing a multiband uplink signal for a satellite uplink, the method comprising:
  upconverting at least two input signals to uplink signals by at least two uplink converters;
  linearizing the upconverted input signals and output linearized signals by at least two linearizers;
  amplify linearized signals and output amplified signals by at least two amplifiers;
  combining the amplified signals and outputting a combined signal as a multiband uplink signal by a combiner;
  receiving at least two input signals by an input interface; and
  providing each of the received input signals to one of the at least two uplink converters, wherein a bandwidth of each of the at least two input signals is a partial bandwidth of an aggregate bandwidth of a master signal.

10. The method of claim 9, comprising
  splitting a master signal with an input bandwidth to at least two partial signals, wherein each partial signal has a predetermined bandwidth which is smaller than the bandwidth of the master signal, and
  providing each of the at least two partial signals to one of the at least two uplink converters in parallel.

11. The method of claim 9, wherein the amplification of each linearized signal is performed by an amplifier which is implemented as a separate device.

12. The method of claim 11, wherein each of the at least two amplifiers comprises a separate controller, and the operation of each controller is controlled by the controller of the respective amplifier.

13. The method of claim 9, wherein the upconverting of each uplink converter is performed according to a selectable frequency band.

14. The method of claim 9, wherein the upconverting is applied to overlapping frequency bands.

15. The method of claim 9, wherein the combining is performed by a waveguide combiner.

16. The method of claim 9, comprising adaptively controlling the linearization according to a feedback from the amplifier connected to the respective linearizer.

17. A satellite uplink amplifier for providing a multiband uplink signal, comprising:
  at least two uplink converters, each uplink converter being configured to upconvert an input signal to an uplink signal;
  at least two linearizers, each linearizer being configured to linearize one of the upconverted input signals and output a linearized signal;
  at least two amplifiers, each amplifier being configured to amplify one of the linearized signals and output an amplified signal;
  a combiner for combining the amplified signals and outputting a combined signal as a multiband uplink signal; and
  a splitter for receiving a master signal with an input bandwidth, splitting the master signal to at least two partial signals, each partial signal having a predetermined bandwidth which is smaller than the bandwidth of the master signal, and providing each of the at least two partial signals to one of the at least two uplink converters in parallel.

18. A method for providing a multiband uplink signal for a satellite uplink, the method comprising:
  upconverting at least two input signals to uplink signals by at least two uplink converters;
  linearizing the upconverted input signals and output linearized signals by at least two linearizers;
  amplify linearized signals and output amplified signals by at least two amplifiers;
  combining the amplified signals and outputting a combined signal as a multiband uplink signal by a combiner;
  splitting a master signal with an input bandwidth to at least two partial signals, wherein each partial signal has a predetermined bandwidth which is smaller than the bandwidth of the master signal; and
  providing each of the at least two partial signals to one of the at least two uplink converters in parallel.

* * * * *